(12) United States Patent
Fox et al.

(10) Patent No.: US 11,650,925 B2
(45) Date of Patent: May 16, 2023

(54) MEMORY INTERFACE MANAGEMENT

(71) Applicant: Micron Technology, Inc., Boise, ID (US)

(72) Inventors: Eric R. Fox, Richfield, MN (US); Nathan A. Eckel, Lucas, TX (US)

(73) Assignee: Micron Technology, Inc., Boise, ID (US)

(*) Notice: Subject to any disclaimer, the term of this patent is extended or adjusted under 35 U.S.C. 154(b) by 89 days.

(21) Appl. No.: 16/717,160

(22) Filed: Dec. 17, 2019

(65) Prior Publication Data

US 2021/0182201 A1 Jun. 17, 2021

(51) Int. Cl.
*G06F 9/30* (2018.01)
*G06F 12/0868* (2016.01)
*G06F 12/06* (2006.01)
*G06F 9/4401* (2018.01)
*G06F 9/38* (2018.01)
*G11C 29/12* (2006.01)
*G06F 9/48* (2006.01)
*G06F 13/16* (2006.01)
*G06F 13/10* (2006.01)

(52) U.S. Cl.
CPC ...... *G06F 12/0868* (2013.01); *G06F 9/30101* (2013.01); *G06F 9/3869* (2013.01); *G06F 9/4411* (2013.01); *G06F 9/4806* (2013.01); *G06F 12/0638* (2013.01); *G06F 13/102* (2013.01); *G06F 13/1689* (2013.01); *G11C 29/12* (2013.01)

(58) Field of Classification Search
CPC ............... G06F 13/102; G06F 13/1689; G06F 12/0868; G06F 12/0638; G06F 9/30101; G06F 9/3869; G06F 9/4411; G06F 9/4806; G11C 29/12
See application file for complete search history.

(56) References Cited

U.S. PATENT DOCUMENTS

| | | |
|---|---|---|
| 9,817,610 B1 | 11/2017 | Shallal et al. |
| 10,031,677 B1 | 7/2018 | Shallal et al. |
| 2016/0011802 A1 | 1/2016 | Berke |
| 2016/0328156 A1* | 11/2016 | Swarbrick ........... G06F 13/4234 |
| 2017/0109058 A1* | 4/2017 | Shallal ................. G06F 3/0685 |
| 2018/0059933 A1 | 3/2018 | Helmick et al. |
| 2018/0107596 A1 | 4/2018 | Kelly et al. |
| 2019/0286560 A1* | 9/2019 | Shallal ............... G06F 12/0802 |
| 2020/0104063 A1* | 4/2020 | Wu .................... G11C 14/0063 |

\* cited by examiner

*Primary Examiner* — Ernest Unelus
(74) *Attorney, Agent, or Firm* — Brooks, Cameron & Huebsch, PLLC

(57) ABSTRACT

A method includes receiving a signal at a memory sub-system controller to perform an operation. The method can further include, in response to receiving the signal, enabling, by the memory sub-system controller, an interface to transfer data to or from a registering clock driver (RCD) component. The RCD component is coupled to the memory sub-system controller. The method can further include transferring the data to or from the RCD component via the interface. The method can further include, in response to the enablement of the interface being unsuccessful, transferring control of a memory device to the memory sub-system controller.

20 Claims, 6 Drawing Sheets

MEMORY INTERFACE MANAGEMENT

TECHNICAL FIELD

Embodiments of the disclosure relate generally to memory sub-systems, and more specifically, relate to memory interface management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
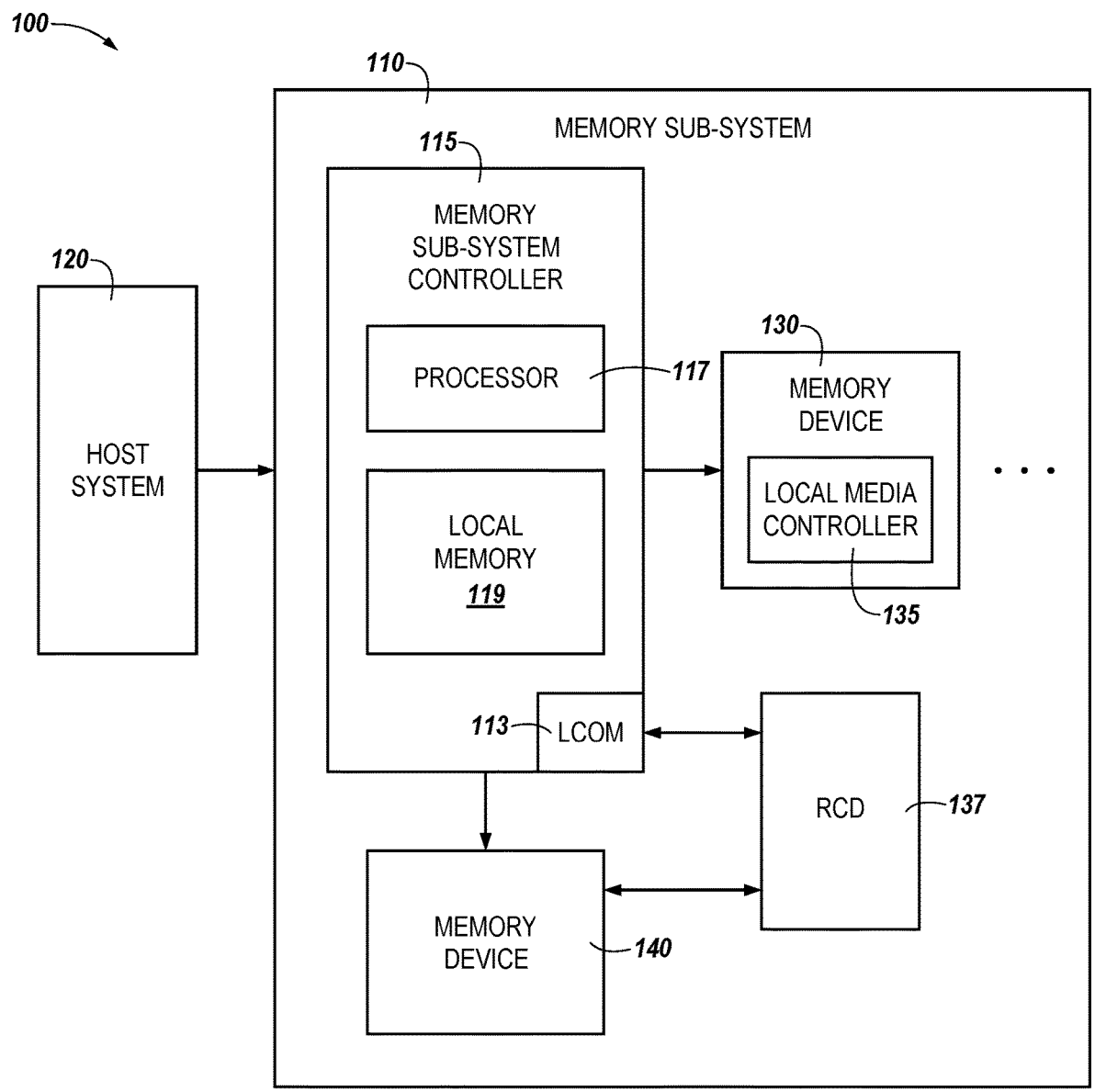
FIG. 1 illustrates an example computing system that includes a memory sub-system in accordance with some embodiments of the present disclosure.

Aspects of the present disclosure are directed to memory interface management associated with a memory sub-system, in particular to memory sub-systems that include an interface component. A memory sub-system can be a storage device, a memory module, or a hybrid of a storage device and memory module. An example of a memory sub-system is a storage system, such as a non-volatile dual in-line memory module (NVDIMM). Examples of storage devices and memory modules are described below in conjunction with FIG. 1. In general, a host system can utilize a memory sub-system that includes one or more components, such as "memory devices" that store data. The host system can provide data to be stored at the memory sub-system and can request data to be retrieved from the memory sub-system.

A non-volatile dual in-line memory module (NVDIMM) is a type of random-access memory that has volatile memory for normal operation and non-volatile memory in which to store the contents of the volatile memory if the power fails, using an on-board backup power source. A host, with respect to a memory unit, can be structured as one or more processors that control data in and out of the memory unit in response to instructions (e.g., an application, program, etc.) being executed by the host. In the event of a power failure, the NVDIMM can copy all the data from its volatile memory (e.g., DRAM or set of DRAMS) to its persistent flash storage and can copy all the data back to the volatile memory when power is restored. The transfer of the state of all the DRAM data into persistent data on the persistent flash storage can be performed on a power cycle. The NVDIMM has its own battery backup power source or access to a dedicated power source to allow the NVDIMM to complete the save.

NVDIMMs can include a variety of different types (N, P, X, F). NVDIMM-N is a dual in-line memory module (DIMM) typically with flash storage and traditional dynamic random-access memory (DRAM) on the same module. A host processing unit can access the traditional DRAM directly. NVDIMM-P can include main memory that is persistent and can share a DDR4 or DDR5 DIMM interconnect with DRAM DIMMs. NVDIMM-X can include a DDR4 DIMM with NAND flash storage and volatile DRAM on a same module. NVDIMM-F can include an NVDIMM with flash storage.

In various embodiments, a set of control registers in an NVDIMM can be implemented to provide for a partial save of memory in the NVDIMM to non-volatile memory, where "memory" refers to the main memory of the NVDIMM. The main memory is the volatile memory, such as a DRAM, which stores user data. The set of control registers can provide a mechanism to conduct a partial save by containing a starting offset of a portion of the volatile memory to identify a location in the volatile memory where a save operation starts and by containing an amount of content of the volatile memory to be saved. A host can populate the set of control registers in the NVDIMM with an identification of a start of a save operation and an amount of content for the save operation. This set of control registers can also control the inverse operation that restores the partial save back to the volatile memory of the NVDIMM. This structure for maintaining data stored on a NVDIMM provides a host with added flexibility to handle user data with respect to applications for which the host is processing. The host is provided access to perform a full content or a partial content save at any offset. This can provide the host with the ability to have better control, and more control over what is saved and restored.

In order to perform the partial save/restore or full save/restore, communication between the host, a registering clock driver (RCD) component, and/or an LCOM interface of a non-volatile memory device (NVM) controller can be used to transfer the control register information or additional save/restore information in order to transfer data to and from the NVM of the NVDIMM. In some approaches, the host provides data to operate and/or initialize the LCOM interface such that the LCOM interface and the RCD can properly communicate without errors. As an example, in the event that the host issues a reset command to the RCD to reset the RCD, RCD settings can be changed. If the LCOM interface is not actively disabled due to the reset of the RCD, the NVDIMM can attempt communications via the RCD to the NVM with incorrect settings, resulting in failures. In order to avoid this scenario, the LCOM interface can be disabled such that communication between the NVM controller and the NVM is prevented.

In contrast, embodiments herein can allow for the LCOM interface to be managed by the NVM controller. In some embodiments, in order to manage the LCOM interface, as is described above, an automatic initialization of the LCOM interface by the NVM controller can be performed in response to beginning a save or restore operation. This allows for operation of the NVDIMM by a host that does not have the capability to manage the LCOM interface without having to reconfigure the host to do so. For example, a basic input/output system (BIOS) of the host can be reconfigured or updated in order to manage an LCOM interface by the host and incur additional costly resources in order to do so. An advantage of the present disclosure includes having the NVM controller manage the LCOM interface to avoid this additional cost when the host is using the NVDIMM.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of memory modules include a dual in-line memory module (DIMM), a small outline DIMM (SO-DIMM), and various types of non-volatile dual in-line memory modules (NVDIMM). Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include various combinations of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type memory (e.g., 2D NAND, 3D NAND) are described, the memory device 130 can be based on any other type of non-volatile memory or storage device, such as such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130, 140 to perform operations such as reading data, writing data, or erasing data at the memory devices 130, 140 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can communicate with a registering clock driver (RCD) component 137 through a memory interface 113 (e.g., an LCOM interface). The RCD component 137 can communicate with (e.g., receive local commands from) the memory sub-system controller 115 using the LCOM interface 113. The LCOM interface 113 is supported by a physical layer communications protocol such as the LCOM interface protocol defined by the Joint Electron Device Engineering Council (JEDEC). The RCD component 137 can include a logical register and a phase-lock loop (PLL) to receive and re-drive command and address input signals from the host 120 to the memory devices 130, 140, thus reducing clock, control, command, and address signal loading by isolating the memory devices 130, 140 from the host 120. However, this dual communication of the RCD component 137 with the host 120 and the memory sub-system controller 115 can lead to conflicts. For example, the RCD component 137 can be reset by the host 120 while the LCOM interface 113 is being initialized for communication of the memory sub-system controller 115 with the RCD component 137, thereby causing the settings of the RCD component 137 (which would be cleared due to reset) to differ from those settings needed for operation of the memory devices 130, 140 by the memory sub-system controller 115.

In some embodiments, the host 120 can issue a reset to the RCD component 137 that can change the RCD settings from values used by the memory sub-system controller 115 to perform a save or restore operation to values that prevent such save or restore operations. Such resets can also cause the LCOM interface 113 to be disabled to prevent conflicting communication. An automatic LCOM initialization operation performed prior to an Arm-Save command from the host 120 can prevent failure due to a prerequisite of the LCOM interface 113 needing to be initialized. In addition, an automatic LCOM initialization operation performed prior to a save or restore operation can result in successfully performing the save or restore operation because the RCD component settings for communication between the memory sub-system controller 115 and the memory devices 130, 140 is restored. In the event that the RCD component 137 is reset, initialization of the LCOM interface 113 can wait until the reset has fully completed. In some embodiments, a verify operation can be performed to read RCD register values that can verify whether the LCOM interface 113 is currently initialized and that the RCD component 137 has preserved the written RCD register values. This verify operation can also indicate whether the RCD component 137 has been reset between the writing of the RCD register values and the reading of the RCD register values. In response to the RCD component 137 being reset, the RCD register values will have been set back to their default values and can differ from the RCD register values used for operation of the LCOM interface 113.

An automatic LCOM enablement (or initialization) can be performed when a save operation is not initiated by a power failure, leaving control of a volatile memory device at the host 120 so the host 120 can continue to use the volatile memory device in case of failure. An automatic LCOM enablement can be performed when a restore operation is initiated, leaving the volatile memory control unchanged (e.g., left with the host 120). An automatic LCOM enablement can be performed when an Arm-Save command is issued by the host 120, leaving control of the volatile memory device unchanged. The LCOM interface 113 can be enabled, as this can be a prerequisite for performing the Arm-Save operation.

In some embodiments, an automatic LCOM initialization can be performed for recovery for saves due to a power failure. A host 120 can configure the memory sub-system 110 for a catastrophic save operation before a power failure occurs. When power is lost to the host 120, a save signal can activate, triggering the memory sub-system controller 115 to execute an LCOM save configuration sequence which had been previously registered for a save trigger. The sequence can transfer control of the volatile memory device, command/address interfaces, and clock data from the host to the memory sub-system controller 115. The sequence can also configure the RCD settings for the memory sub-system controller 115 save operation. Completion of this save configuration sequence can generate an interrupt signal (e.g., a Save Configuration Sequence Done interrupt signal). The interrupt signal can cause execution of a save initialization. The save initialization can block resets from the host 120 to the RCD component 137 and catastrophic non-volatile memory saves are disabled. These two actions prevent errors occurring while the RCD component 137 operates and while signals are being transferred. A partial version of the LCOM save configuration sequence can then be performed.

The partial version of the LCOM save configuration sequence includes indicating that the memory sub-system controller 115 controls the volatile memory device, command/address interfaces, and clock data. The volatile memory self-refresh state is saved for later use. The LCOM initialization verify sequence is executed, and upon detection of RCD failure an automatic recovery is performed. The automatic recovery includes running a soft LCOM initialization. If the soft LCOM initialization succeeds, an LCOM save configuration sequence is re-run, leaving control of the volatile memory device, command/address interfaces, and clock data with the memory sub-system controller 115. If either the soft LCOM initialization or the LCOM save configuration sequence fails, a full LCOM initialization is performed. If the full LCOM initialization succeeds, the LCOM save configuration sequence is re-run, leaving control of the volatile memory device with the memory sub-system controller 115. If the LCOM initialization and the subsequent LCOM save configuration sequence succeeds, the self-refresh state is processed and the LCOM interface 113 interrupts are enabled, RCD interrupts to the memory sub-system controller 115 are conditionally enabled, and the LCOM enable bit is set to indicate that the LCOM initialization was successful in the host-readable register of the RCD component 137. Upon completion of the automatic LCOM initialization and save initialization described above, data stored in the volatile memory device is saved to the non-volatile memory device. Upon completion of the save operation, resets from the host 120 to the RCD component 137 are unblocked (or allowed).

In some embodiments, a data sequence can be transmitted from the memory sub-system controller 115 to the RCD component 137 via the LCOM interface 113. This data sequence can be written into RCD registers configured to store operational settings, including clock frequency, termination resistance and reference voltage, address mirroring, chip select mode, output enables, drive strength, output polarity, etc. After the data transmission, a reset state of the RCD component 137 and LCOM signals can be checked to detect discrepancies between the host 120 and other commands from the memory sub-system controller 115. If the operations above succeed, RCD interrupt communication to the memory sub-system controller 115 is enabled. In addition, an LCOM enable bit in the host-readable register of the RCD component 137 is set to indicate that the LCOM initialization succeeded.

In some embodiments, an automatic LCOM initialization with recovery for restore operations can be requested by the RCD component 137. When the restore operation is requested by the RCD component 137, the automatic LCOM initialization can be performed by the following. A host 120 can write a particular bit (e.g., a "1") to one of a lower two bits of an RCD register of the RCD component 137 which triggers the memory sub-system controller 115 to execute an LCOM restore configuration sequence. This LCOM restore configuration sequence can transfer control of the volatile memory device, command/address interfaces, and clock data from the host 120 to the memory sub-system controller 115. The memory sub-system controller 115 configures the RCD settings for the restore operation.

Completion of this restore configuration sequence can generate an interrupt signal (e.g., a Restore Configuration Sequence Done interrupt signal). The interrupt signal can cause execution of a restore initialization. The restore initialization can execute a partial version of the LCOM restore configuration sequence.

The partial version of the LCOM restore configuration sequence includes indicating that the memory sub-system controller 115 controls the volatile memory device, command/address interfaces, and clock data. The volatile memory self-refresh state is saved for later use. The LCOM initialization verify sequence is executed, and upon detection of RCD failure an automatic recovery is performed. The automatic recovery includes running a soft LCOM initialization. If the soft LCOM initialization succeeds, an LCOM restore configuration sequence is performed, leaving control of the volatile memory device, command/address interfaces, and clock data with the memory sub-system controller 115. If either the soft LCOM initialization or the LCOM restore configuration sequence fails, a full LCOM initialization is performed. If the full LCOM initialization succeeds, the full LCOM initialization is re-run, leaving control of the volatile memory device with the memory sub-system controller 115. If the LCOM initialization and the subsequent LCOM restore configuration sequence succeeds, the self-refresh state is processed and the LCOM interface 113 interrupts are enabled, RCD interrupts to the memory sub-system controller 115 are conditionally enabled, and the LCOM enable bit is set to indicate that the LCOM initialization was successful in the host-readable register of the RCD component 137. Upon completion of the automatic LCOM initialization and restore initialization described above, data stored in the non-volatile memory device is restored to the volatile memory device.

In some embodiments, when a memory sub-system 110 (e.g., an NVDIMM device) initializes, the memory sub-system controller 115 can begin a command task, which can conditionally initialize the LCOM interface 113. If the RCD component 135 is actively being reset, LCOM interrupts can be disabled and an LCOM ENABLE bit can be cleared to indicate the LCOM interface 113 is not enabled due to an RCD reset.

In some embodiments, the LCOM interface 113 can be initialized by the memory sub-system controller 115 prior to performing a save operation, a restore operation, a host-initiated Arm/Save command, and/or a built-in self-test (BIST) operation. A verification that the communication from the memory sub-system controller 115 to the RCD component 137 through the LCOM interface 113 can be determined during the save operation or the restore operation to implement failure detection and correction mechanisms.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

In some embodiments, which of the host 120, the memory sub-system controller 115, or some other device controls the memory device 140 can be determined and/or tracked in order to manage control of the memory device 140. Further, a change in control of the memory device 140 can also be monitored. As an example, the control of the memory device 140 can include one of: control of the memory device 140 remaining the same (e.g., whichever device that controlled the memory device 140 prior to an operation also controls the memory device 140 subsequent to the operation); the host 120 controls the memory device 140, the command/address interfaces, and/or clock data; the memory subsystem controller 115 controls the memory device 140, the command/address interfaces, and/or the clock data; or the host 120 controls the memory device clocks while the memory sub-system controller 115 controls the memory device 140 and its corresponding command/address interfaces.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

As described in more detail in connection with FIG. 2 and FIG. 3, the LCOM interface 113 can be communicatively coupled to the RCD component 137 and can access the memory device 130, the memory device 140, internal data paths of the memory sub-system 110, and/or interfaces of the memory sub-system 110 via other pathways to perform the operations described herein. In some embodiments, the operations performed by use of the LCOM interface 113 can be performed during an initialization or pre-initialization stage of data transfer within the memory sub-system 110 and/or the memory sub-system controller 115.

Although not shown in FIG. 1 so as to not obfuscate the drawings, the memory sub-system 110 can include various circuitry to facilitate grading and allocation of the sets of memory cells. For example, the memory sub-system 110 can include a special purpose circuitry in the form of an ASIC, FPGA, state machine, and/or other logic circuitry that can allow the memory sub-system controller 115 to orchestrate and/or perform operations to perform a save operation or restore operation using various components, data elements, and/or interfaces of the memory device 130 and transfer the saved or restored data to other various components of the memory sub-system 110.

As described in more detail in connection with FIG. 2 and FIG. 3, the RCD component 137 can be communicatively coupled to the memory sub-system controller 115 via the LCOM interface 113 and can access the memory sub-system controller 115, the memory device 140, internal data paths of the memory sub-system 110, and/or interfaces of the memory sub-system 110 to perform the operations described herein and/or to transfer data to additional elements of the memory sub-system 110. In some embodiments, the operations performed via the LCOM interface 113 and the RCD component 137 can be performed during an initialization or pre-initialization stage of data transfer from or to the memory device 130 and/or within the memory sub-system 110.

In some embodiments, data stored in volatile memory can be saved to non-volatile memory. When a save operation is performed, an LCOM command sequence can be executed. The LCOM sequence execution can capture a self-refresh state before taking control of the volatile memory device from the host. Control of the volatile memory device can be shifted to the memory sub-system controller 115 and the RCD component 137 can be configured for memory sub-system controller (NVC controller) 115 memory operations. RCD registers can then be set to operation settings. The LCOM initialization verify sequence can run to ensure that required settings for operating the NVDIMM are active. This LCOM command sequence generalized to support save operations initiated via a save due to power failure signal as well as a save initiated from the host 120. In this way, the state of the sequence is executed identical regardless of the initiator of the save operation. Upon completion of the sequence, volatile memory data, if any, is erased, and the volatile memory data is saved into the non-volatile memory and control of the volatile memory device is returned to the host.

In some embodiments, non-volatile memory data is restored to volatile memory. When a volatile memory data restore operation is signaled from the RCD component 137, or a restore operation is initiated by the host 120, automatic LCOM initialization is performed. The restore operation is performed similar to the save operation described above except non-volatile memory data is saved into the volatile memory device.

Figure 2:
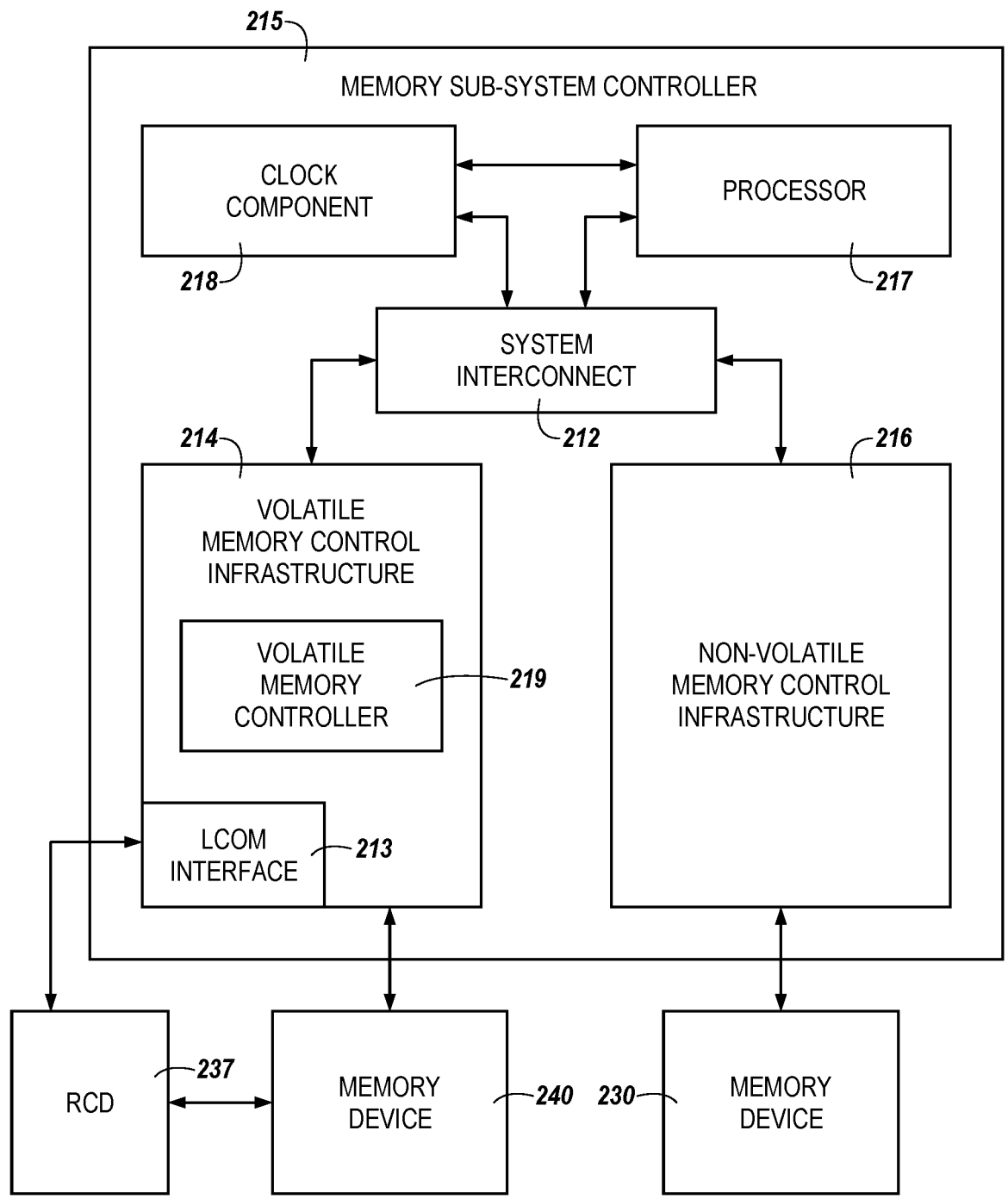
FIG. 2 illustrates an example of a memory sub-system controller and interface component in accordance with some embodiments of the present disclosure.

FIG. 2 illustrates an example of a memory sub-system controller 215 and LCOM interface 213 in accordance with some embodiments of the present disclosure. The memory sub-system controller 215 can be analogous to the memory sub-system controller 115 illustrated in FIG. 1 and the LCOM interface 213 can be analogous to the LCOM interface 113 illustrated in FIG. 1. Further, the processor 217 can be analogous to the processor 117 illustrated in FIG. 1, the memory device 230 can be analogous to the memory device 130 illustrated in FIG. 1 and the memory device 240 can be analogous to the memory device 140 illustrated in FIG. 1. In addition to the LCOM interface 213, the processor 217, the memory device 230, and the memory device 240, the memory sub-system controller 215 can further include a clock component 218, a system interconnect 212, volatile memory control infrastructure 214, which can include a volatile memory controller 219, and non-volatile memory control infrastructure 216.

The clock component 218 can provide timing signals to the memory sub-system controller 215 to facilitate performance of memory operations orchestrated by the memory sub-system controller 215. In some embodiments, the clock component 218 can be a register clock driver that can be configured to buffer and/or re-drive commands and/or addresses to the memory device 230 and/or the memory device 240 during operation of the memory sub-system controller 215.

The system interconnect 212 can be a communication sub-system that can allow commands, signals, instructions, and the like to be passed between the processor 217, clock component 218, volatile memory control infrastructure 214, and the non-volatile memory control infrastructure 216. The system interconnect 212 can be a crossbar ("XBAR"), a network on a chip, or other communication subsystem that allows for interconnection and interoperability between the processor 217, clock component 218, volatile memory control infrastructure 214, and the non-volatile memory control infrastructure 216. For example, the system interconnect 212 can facilitate visibility between the processor 217, clock component 218, volatile memory control infrastructure 214, and the non-volatile memory control infrastructure 216 to facilitate communication therebetween. In some embodiments, communication between the processor 217, clock component 218, volatile memory control infrastructure 214, and the non-volatile memory control infrastructure 216 via the system interconnect 212 can be provided via respective data paths (shown by the arrows connecting the system interconnect 212 to the other components of the memory sub-system controller 215). These data paths can be used to share commands indicating to save or restore particular portions of data.

The volatile memory control infrastructure 214 can include circuitry to control data transfers between the memory device 230 and a host, such as the host system 120 illustrated in FIG. 1. For example, the volatile memory control infrastructure 214 can include various interfaces (such as LCOM interface 213), direct media access components, registers, and/or buffers.

The non-volatile memory control infrastructure 216 can include circuitry to control data transfers between the memory device 240 and a host, such as the host system 120 illustrated in FIG. 1. For example, the non-volatile memory control infrastructure 216 can include various interfaces, direct media access components, registers, and/or buffers.

In the embodiment illustrated in FIG. 2, the LCOM interface 213 is resident on the volatile memory control infrastructure 214. As used herein, the term "resident on" refers to something that is physically located on a particular component. For example, the LCOM interface 213 being "resident on" the volatile memory control infrastructure 214 refers to a condition in which the LCOM interface 213 is physically located on the volatile memory control infrastructure 214. The term "resident on" can be used interchangeably with other terms such as "deployed on" or "located on," herein. As described above, the LCOM interface 213 and the RCD component 237 can be configured to facilitate performance of operations of the memory sub-system controller 215 and/or a memory subsystem (e.g., the memory sub-system 110 illustrated in FIG. 1) in which the memory sub-system controller 215 is deployed. For example, the LCOM interface 213 and the RCD component 237 can be configured to perform a save operation, a restore operation, a Save/Arm operation, etc. (e.g., for performing a full or partial restore or save).

Figure 3:
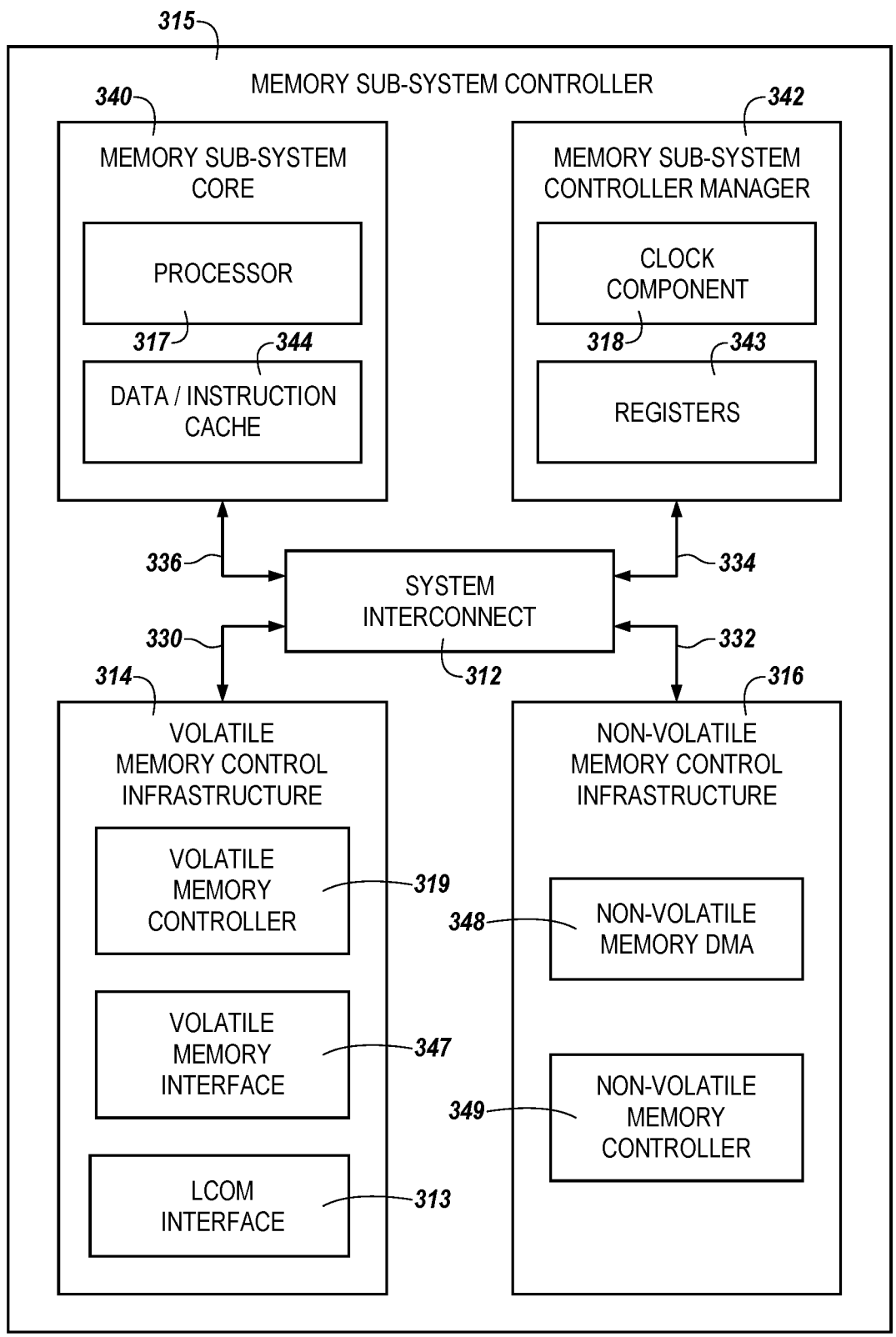
FIG. 3 illustrates another example of a memory sub-system controller and interface component in accordance with some embodiments of the present disclosure.

FIG. 3 illustrates another example of a memory sub-system controller 315 and LCOM interface 313 in accordance with some embodiments of the present disclosure. The memory sub-system controller 315 can be analogous to the memory sub-system controller 215 illustrated in FIG. 2 and the LCOM interface 313 can be analogous to the LCOM interface 213 illustrated in FIG. 2. Further, the processor 317, the system interconnect 312, volatile memory control infrastructure 314, the volatile memory controller 319, and non-volatile memory control infrastructure 316 can be analogous to the processor 217, the system interconnect 212, volatile memory control infrastructure 214, the volatile memory controller 219, and non-volatile memory control infrastructure 216 illustrated in FIG. 2.

As shown in FIG. 3, the memory sub-system controller 315 can further include a memory sub-system core 340, which can include the processor 317 and a data and/or instruction cache 344. In addition, the volatile memory control infrastructure 314 can include a volatile memory interface 347, the volatile memory controller 319, and an LCOM interface 313. Further, the non-volatile memory control infrastructure 316 can include a non-volatile memory direct memory access (DMA) component 348 and a non-volatile memory controller 349.

The memory sub-system core 340 can be coupled to the system interconnect 312 via a data path 336, which can allow for commands, signals, data, and other information to be transferred between the memory sub-system core 340, the volatile memory control infrastructure 314, and the non-volatile memory control infrastructure 316. The memory sub-system core 340 can be a reduced instruction set computing (RISC) device such as a RISC-V device. In some embodiments, the memory sub-system core 342 can be a XILINX® MicroBlaze soft processor core, or other suitable processing core.

Figure 4:
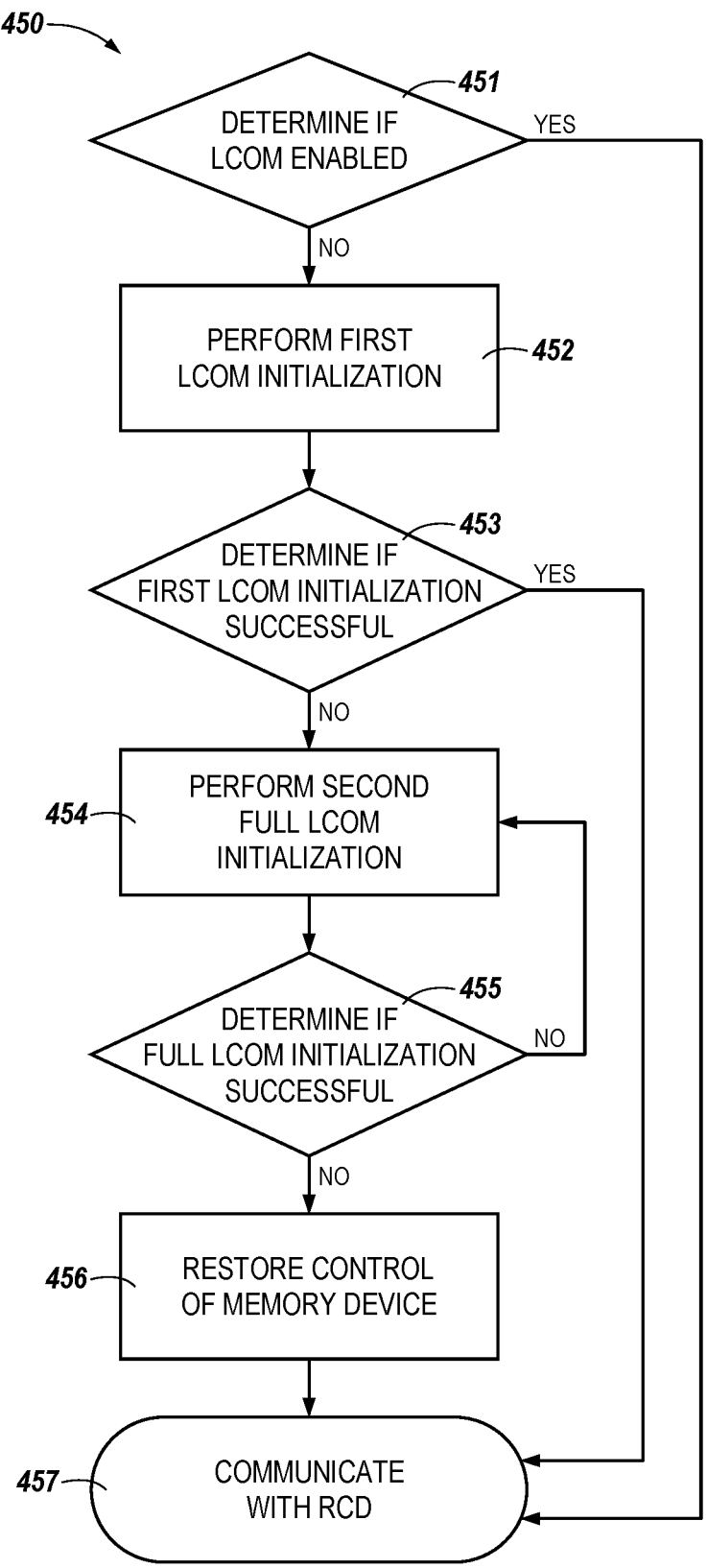
FIG. 4 illustrates a flow diagram corresponding to memory interface management in accordance with some embodiments of the present disclosure.
Figure 5:
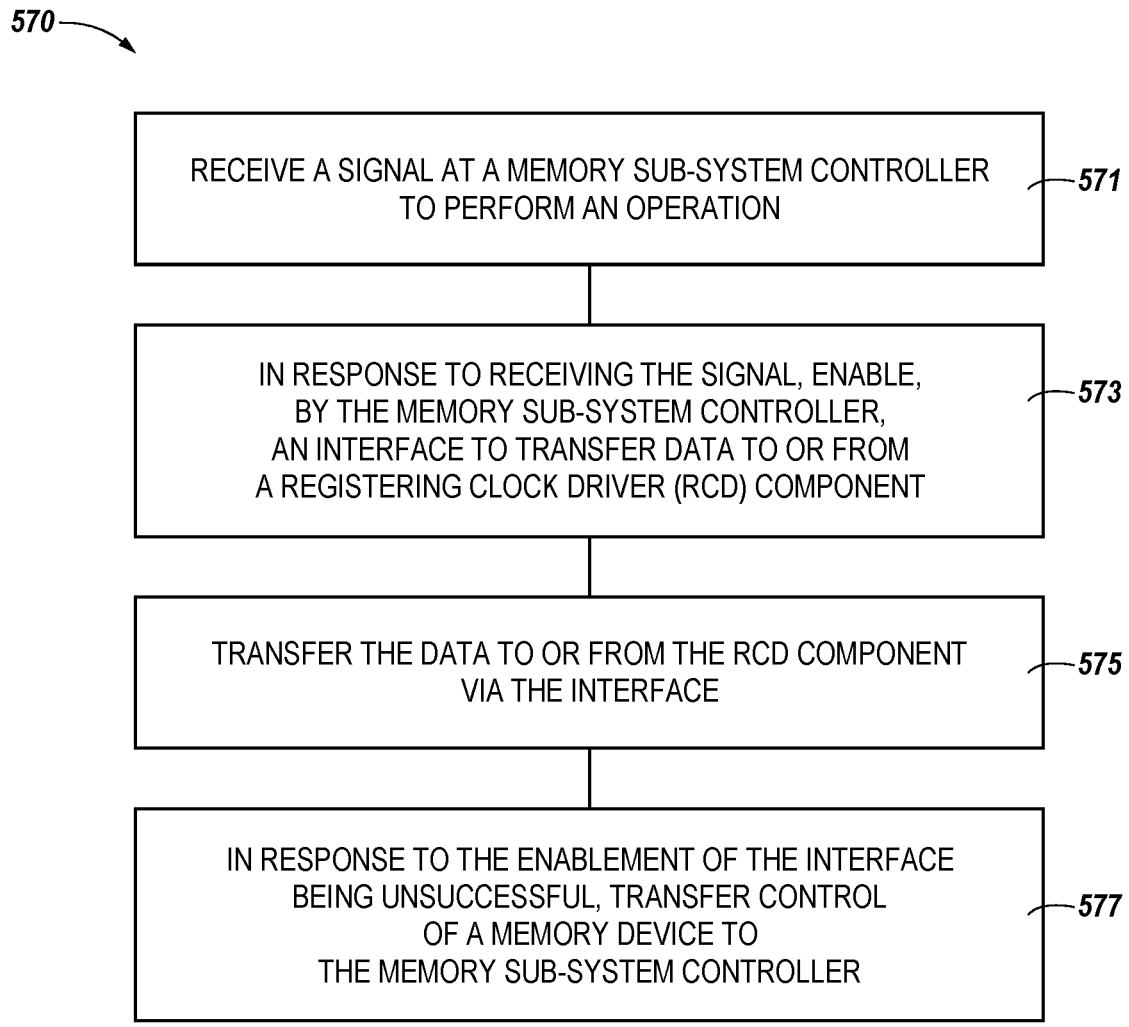
FIG. 5 is a flow diagram corresponding to a method for performing memory interface management in accordance with some embodiments of the present disclosure.

FIGS. 4-5 each illustrate a flow diagram corresponding to a method 450, 570 for performing memory sub-system operations to manage a memory interface in accordance with some embodiments of the present disclosure. Each respective method 450, 570 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, each method 450, 570 is performed using the LCOM interface 113 of FIG. 1, the LCOM interface 213 of FIG. 2, and/or the LCOM interface 313 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

FIG. 4 illustrates a flow diagram 450 corresponding to memory sub-system operations to manage a memory interface in accordance with some embodiments of the present disclosure. At operation 451, a determination of whether the LCOM interface (such as LCOM interface 113) is enabled can be performed. As an example, a bit can be set when the LCOM interface is enabled and the location of the bit can be checked in order to determine whether the LCOM interface is enabled. In response to the LCOM being enabled, at operation 457, communication with the RCD component (such as RCD component 137) can begin.

In response to a determination that the LCOM interface is not enabled, at operation 452, a first LCOM initialization can be performed. In one example, the first LCOM initialization can be referred to as a soft LCOM initialization and can include using a command sequence that does not take control of a memory device (e.g., memory device 130, 140) from a host (unless explicitly requested by the host to do so). The soft LCOM initialization can be performed by a memory sub-system controller (such as memory sub-system controller 115) and can be performed after one of a firmware restart, during a first attempt at automatic LCOM initialization, or during an initial recovery operation performed by a save operation or a restore operation. In one embodiment, in response to an error occurring during the soft LCOM initialization, all non-volatile memory controller status states can be set to indicate that the LCOM interface is initialized. This can be used by conditional LCOM initializations that were requested to perform particular operations that includes not taking control of the memory devices from the host (e.g., leaving control of the memory devices with the host). This particular operation can be used on systems where NVDIMM DRAM is used by the host except for during a save or restore operation.

At operation 453, a determination of whether the first LCOM initialization is successful can be performed. In response to the first LCOM initialization being successful, at operation 457, communication with the RCD component can begin. At operation 454, in response to the first LCOM initialization being unsuccessful, a second full LCOM initialization can be performed. The second full LCOM initialization can use a command sequence that takes control of the memory devices from the host to enable more complete communication with the RCD component. This full initialization mode, if used during a period of host activity, can forcibly prevent host-to-memory device communication. A full initialization can be performed: when the host requests setting an LCOM enable bit; after a soft initialization (e.g., the first initialization) during automatic LCOM initialization has failed; or during a save operation retry or a restore operation retry. The full initialization can retry the command sequence to the RCD component up to a particular number of times (e.g., 3 times, 4 times, 5 times, 6 times, etc.) if a failure is detected. Between each of these retries, the memory sub-system controller and the memory device (e.g., DRAM memory device) control hardware can be reset. In some embodiments, prior to sending the sequence, the LCOM bus LCOM0 and LCOM1 signals must be inactive (e.g., zero). The signals being inactive can verify that there is no other current activity on the bus/interface. If all retries fail, a controller hardware error bit can be set. At operation 455, a determination whether the full LCOM initialization was successful can be performed. In response to the full initialization being unsuccessful, operation 454 can be repeated and an additional full LCOM initialization can be performed. At operation 456, in response to the full LCOM initialization being successful, control of the memory device can be restored to the host. At operation 457, communication with the RCD component can begin or be restored.

FIG. 5 is a flow diagram corresponding to a method 570 for performing memory sub-system operations to manage a memory interface in accordance with some embodiments of the present disclosure. The method 570 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. At operation 571, the method 570 can include receiving a signal, at a memory sub-system controller, to perform at operation. The operation can include a save operation, a restore operation, a Save/Arm operation, etc. The memory sub-system controller can be analogous to the memory sub-system controller 115 of FIG. 1, the memory sub-system controller 215 of FIG. 2, and/or the memory sub-system controller 315 of FIG. 3.

At operation 573, the method 570 can include, in response to receiving the signal, enabling, by the memory sub-system controller, an interface to transfer data to or from a registering clock driver (RCD) component. The RCD component can be analogous to the RCD component 137 of FIG. 1, the RCD component 237 of FIG. 2, and/or the RCD component 337 of FIG. 3, and the interface can be analogous to the LCOM interface 113 of FIG. 1, and/or the LCOM interface 213 of FIG. 2.

At operation 575, the method 570 can include transferring the data to or from the RCD component via the interface. At operation 577, the method can include, in response to the enablement of the interface being successful, transferring control of a memory device to the memory sub-system controller. The memory device can be analogous to the memory device 130 and/or the memory device 140 of FIG. 1, and/or the memory device 230 and/or the memory device 240 of FIG. 2.

In some embodiments, the method 570 can include, in response to the enablement of the interface being successful, maintaining control of the memory device by a device that previously had control of the memory device. The device that maintains control is a host coupled to the memory device. Transferring control of the memory device can include transferring control of a dynamic random access memory (DRAM) device to the memory sub-system controller. The method 570 can further include enabling the interface without modifying a Basic Input/Output System (BIOS) associated with a host that is in communication with the memory sub-system controller. The method 570 can further include sending a reset signal to the RCD component to cause the interface to be disabled. The method 570 can further include monitoring which device or component is managing the memory device. In some embodiments, the memory device, additional buses, and a memory clock are managed by a host. In some embodiments, the memory device, additional buses, and a memory clock are managed by the memory sub-system controller. The memory clock can be managed by the host and the memory device and the additional buses can be managed by the memory sub-system controller.

In some embodiments, the memory device can be a volatile memory device and a memory device different than the memory device can be a non-volatile memory device (or vice versa). For example, the memory device can be a system memory device, such as a DRAM (e.g., a dual-ported RAM) memory device, and the memory device different than the memory device can be a storage device, such as a NAND memory device, a three-dimensional cross-point memory device, or other non-volatile memory device.

Figure 6:
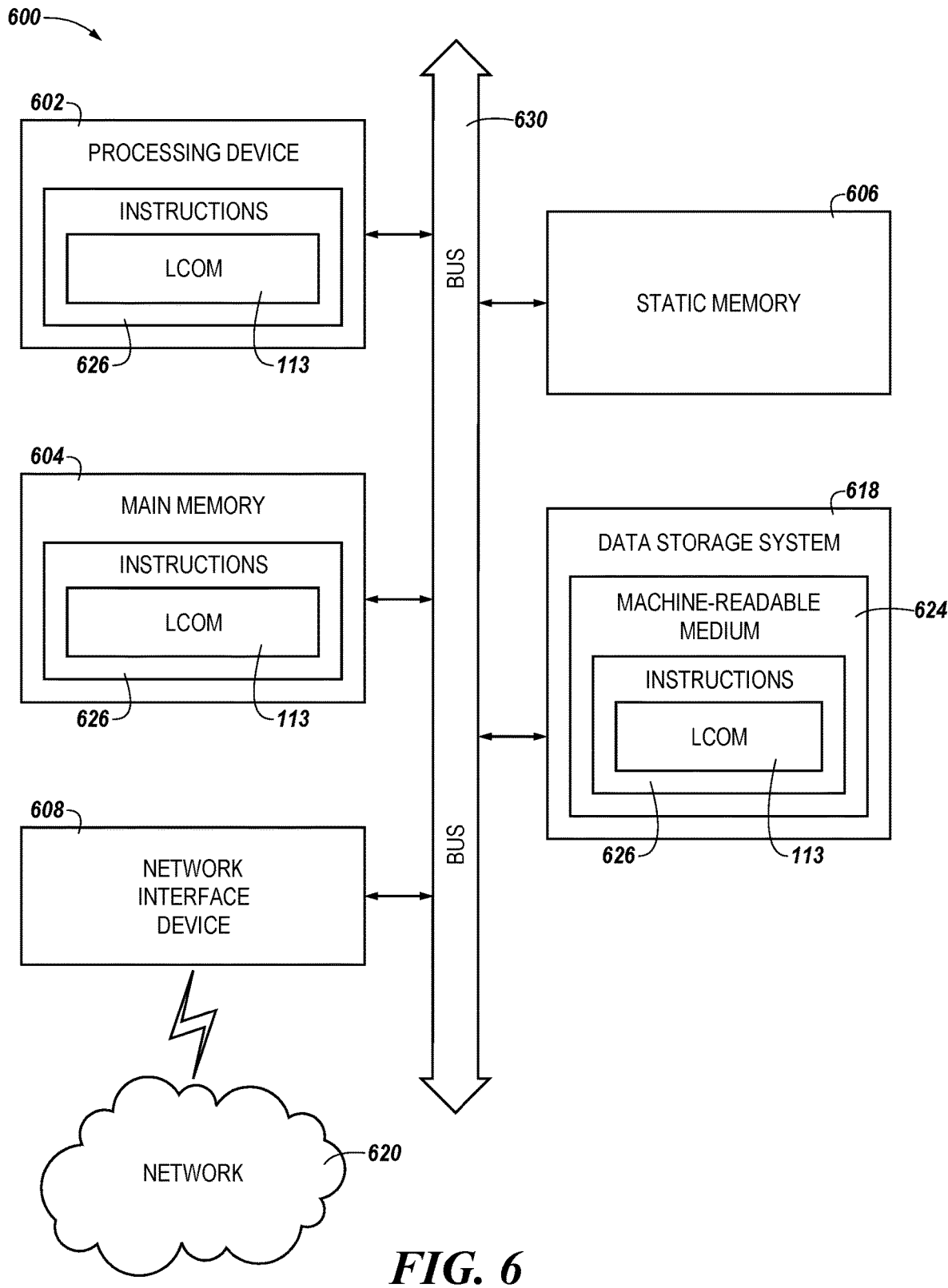
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the LCOM interface 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620. In some embodiments, the main memory 604 or system 618 can be an NVDIMM such as is described in association with FIGS. 2-3.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a memory interface (e.g., the LCOM interface 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A method, comprising:
receiving a signal at a memory sub-system controller to perform an operation;
in response to receiving the signal, enabling, by the memory sub-system controller, an interface within the memory sub-system controller to transfer data to or from a registering clock driver (RCD) component, wherein:
the memory sub-system controller comprises a local communication (LCOM) interface to couple the memory sub-system controller to the RCD component;
the RCD component is external to and coupled to the memory sub-system controller and to a memory device; and
the RCD component comprises a logical register and a phase-lock loop (PLL) to receive and re-drive command and address input signals from a host to the memory device to reduce clock, control, command, and address signal loading;
transferring the data to or from the RCD component via the interface; and
in response to the enablement of the interface being unsuccessful, transferring control of the memory device associated with the memory sub-system controller to the memory sub-system controller to perform operations not initiated by a host.

2. The method of claim 1, further comprising, in response to the enablement of the interface being successful, maintaining control of the memory device by a device that previously had control of the memory device.

3. The method of claim 2, wherein the device that maintains control is the host coupled to the memory device.

4. The method of claim 1, wherein transferring control of the memory device comprises transferring control of a dynamic random access memory (DRAM) device to the memory sub-system controller.

5. The method of claim 1, further comprising enabling the interface without modifying a Basic Input/Output System (BIOS) associated with the host that is in communication with the memory sub-system controller.

6. The method of claim 1, further comprising sending a reset signal to the RCD component to cause the interface to be disabled.

7. The method of claim 1, further comprising monitoring which device or component is managing the memory device.

8. The method of claim 7, wherein the memory device, additional buses, and a memory clock are managed by the host.

9. The method of claim 7, wherein the memory device, additional buses, and a memory clock are managed by the memory sub-system controller.

10. The method of claim 7, wherein a memory clock is managed by the host and the memory device and additional buses are managed by the memory sub-system controller.

11. A system, comprising:
a volatile memory device of a non-volatile dual in-line memory module (NVDIMM);
a memory sub-system controller of the NVDIMM coupled to the volatile memory device; and
a registering clock driver (RCD) component coupled to the memory sub-system controller;
wherein:
the memory sub-system controller comprises a local communication (LCOM) interface to couple the memory sub-system controller to the registering clock driver (RCD) component;
the RCD component is coupled to the volatile memory device, is external to the memory sub-system controller, and configured to receive command and address input signals associated with the volatile memory device;
the RCD component comprises a logical register and a phase-lock loop (PLL) to receive and re-drive command and address input signals from a host to the memory device to reduce clock, control, command, and address signal loading; and
the memory sub-system controller to perform operations comprising enabling and managing the LCOM interface independent of modification to a basic input/output system (BIOS) of the host associated with the memory sub-system controller, wherein the memory sub-system controller performs the operations independent of initiation of the operations by the host.

12. The system of claim 11, wherein the memory sub-system controller is configured to enable the LCOM interface prior to performing a save operation, a restore operation, or the host-initiated Arm-Save command.

13. The system of claim 11, wherein the memory sub-system controller is configured to enable the LCOM interface prior to performing a built-in self-test (BIST).

14. The system of claim 11, wherein the memory sub-system controller is configured to enable the LCOM interface without obtaining control of the volatile memory device.

15. The system of claim 11, wherein the memory sub-system controller is configured to enable the LCOM interface and control the volatile memory device.

16. A system, comprising:
a volatile memory device;
a memory-subsystem controller coupled to the volatile memory device, wherein:
the memory sub-system controller comprises a local communication (LCOM) interface to couple the memory sub-system controller to a registering clock driver (RCD) component;
the RCD component is coupled to the volatile memory device and to the memory sub-system controller, is external to the memory sub-system controller, and is configured to receive command and address input signals associated with the volatile memory device;
the RCD component comprises a logical register and a phase-lock loop (PLL) to receive and re-drive command and address input signals from a host to the memory device to reduce clock, control, command, and address signal loading; and
the memory sub-system controller is configured to perform either of:
a soft LCOM initialization, wherein the soft LCOM initialization includes maintaining control of the volatile memory device by the host coupled to the memory sub-system controller; or
a full LCOM initialization, wherein the full LCOM initialization includes transferring control of the volatile memory device to the memory sub-system controller, wherein the memory sub-system controller performs an operation associated with the full LCOM initiation independent of receiving a command from the host to perform the operation.

17. The system of claim 16, further comprising the registering clock driver (RCD) component coupled to the LCOM interface and the volatile memory device.

18. The system of claim 16, wherein the memory sub-system controller configured to perform the full LCOM initialization comprises the memory sub-system controller configured to prevent the host associated with the volatile memory device from communicating with the volatile memory device.

19. The system of claim 16, wherein the memory sub-system controller is configured to perform the full LCOM initialization in response to at least one of:
- the host coupled to the memory sub-system controller sending a request to set an enable bit associated with the LCOM interface;
- the soft initialization failing;
- performance of a retry of a save operation or a restore operation; or
- any combination thereof.

20. The system of claim 16, wherein the memory sub-system controller is configured to return management of the volatile memory device to the host in response to completion of the full initialization.

* * * * *